(12) United States Patent
Kerber et al.

(10) Patent No.: US 8,917,012 B2
(45) Date of Patent: Dec. 23, 2014

(54) POROUS HEAT SINK LED LAMPS

(75) Inventors: Stefan Kerber, Bregenz (AT); Istvan Bakk, Törökbalint (HU)

(73) Assignee: Tridonic Jennersdorf GmbH, Jennersdorf (AT)

( * ) Notice: Subject to any disclaimer, the term of this patent is extended or adjusted under 35 U.S.C. 154(b) by 9 days.

(21) Appl. No.: 13/993,177

(22) PCT Filed: Dec. 15, 2011

(86) PCT No.: PCT/EP2011/072858
§ 371 (c)(1),
(2), (4) Date: Aug. 12, 2013

(87) PCT Pub. No.: WO2012/084671
PCT Pub. Date: Jun. 28, 2012

(65) Prior Publication Data
US 2013/0313959 A1    Nov. 28, 2013

(30) Foreign Application Priority Data

Dec. 22, 2010  (DE) .......................... 10 2010 063 925
Apr. 14, 2011   (DE) .......................... 10 2011 007 377

(51) Int. Cl.
| | | |
|---|---|---|
| *H01J 1/02* | (2006.01) | |
| *H05K 7/20* | (2006.01) | |
| *F21V 29/00* | (2006.01) | |
| *H01L 23/467* | (2006.01) | |
| *F21Y 101/02* | (2006.01) | |
| *F21K 99/00* | (2010.01) | |

(52) U.S. Cl.
CPC ............ *H05K 7/2039* (2013.01); *F21V 29/405* (2013.01); *H01L 23/467* (2013.01); *F21V 29/004* (2013.01); *F21V 29/246* (2013.01); *F21Y 2101/02* (2013.01); *F21K 9/135* (2013.01)
USPC ............................................ 313/46; 313/110

(58) Field of Classification Search
USPC ............................................................. 313/46
See application file for complete search history.

(56) References Cited

U.S. PATENT DOCUMENTS

| | | | |
|---|---|---|---|
| 8,378,559 B2 * | 2/2013 | Shuja et al. ...................... 313/34 |
| 2010/0033071 A1 | 2/2010 | Heffington et al. | |
| 2011/0089830 A1 * | 4/2011 | Pickard et al. .................. 315/32 |
| 2011/0240260 A1 | 10/2011 | Van Der Tempel | |
| 2013/0114209 A1 * | 5/2013 | Lai et al. ....................... 361/700 |

FOREIGN PATENT DOCUMENTS

DE   102007037862 A1   10/2008

OTHER PUBLICATIONS

International Search Report issued in connection with the corresponding International Application No. PCT/EP2011/072858 on Mar. 29, 2012.

* cited by examiner

*Primary Examiner* — Mary Ellen Bowman
(74) *Attorney, Agent, or Firm* — The H.T. Than Law Group

(57) ABSTRACT

The present invention relates to a heat sink (1), which is in thermal connection with at least one electronic component (4). The heat sink (1) has at least one chamber (2), which has at least one wall with at least one porous element (3a). Pressure producing means (7) are connected to the chamber (2), in order to cyclically modulate the air pressure P1 in the chamber (2). Thus, a "breathing" of air through the at least one porous element (3a) can be achieved and a cooling effect is obtained. Additionally, holes (8) can be provided to the chamber (2), which produce cyclic air jets (9) due to the fluctuating chamber air pressure P1. By providing an interaction of the air jets (9) with the air volume surrounding the at least one porous element (3a), the cooling of the at least one electronic component (4) can be optimized

17 Claims, 5 Drawing Sheets

POROUS HEAT SINK LED LAMPS

BACKGROUND OF THE INVENTION

The present invention relates to a porous heat sink for actively cooling electronic components. In particular the present invention relates to a heat sink, which can be used in an LED lamp, especially a retrofit LED lamp, to cool the electronic components operating the LED lamp.

A retrofit LED lamp is a lamp using one or more white or monochromatic LED(s) as lighting means, and which is provided with electrical and mechanical connection means in order to use the retrofit LED lamp as replacement for incandescent bulbs, halogen lamps, . . . .

Heat transfer from heat sources, like the electronic components of a LED lamp, can be divided into the following processes. First, heat is conducted from the heat source to a heat sink or an air interface. Then, heat diffusion from the heat sink surface to convective regions of the air takes place, and the heat is transported away by convections in the air. The temperature drop is determined by material properties, e.g. the heat conductivity, heat flux density and conduction length of the heat sink. The lower the flux density of the heat sink will be, the lower also the temperature drop and the corresponding cooling effect on the heat sources will be. In practice, the larger the surface of the heat sink is, and the more turbulent the air affecting the surface of the heat sink is, the better the cooling effect of the heat sink will be.

SUMMARY OF THE INVENTION

The present invention aims to improve the performance of a heat sink. In particular, the present invention aims to improve the above-mentioned properties, in order to provide a more efficient cooling to electronic components, for example in a retrofit LED lamp.

The present invention is directed to a heat sink for electronic components comprising a first chamber, wherein at least one electronic component is attached to a first wall of the first chamber, and wherein at least a second wall of the first chamber comprises at least one porous element, and first pressure producing means connected to the first chamber, which are adapted to vary a first chamber air pressure in the first chamber.

Due to the at least one porous element, firstly the surface of the heat sink is increased, thus already providing a better cooling effect. Secondly, the first pressure producing means, which is connected to the first chamber, can move air into or out of the chamber through the at least one porous element by varying the first chamber air pressure. Heat can be transferred away from the chamber and the wall comprising the porous element. Since the electronic component, which produces the heat, is attached to the first wall, which is in thermal contact with the second wall, heat is effectively transported away from the electronic component. The pressure producing means can be inside or outside the first chamber and can be connected to an outer wall thereof.

Preferably, the first pressure producing means are adapted to fluctuate the first chamber air pressure to be alternately higher or lower than the air pressure outside of the first chamber, causing air to be pushed out and suck in of the first chamber through the at least one porous element, respectively.

Due to the pressure fluctuation, the air volume inside the chamber is agitated and is cyclically pushed out and sucked in the chamber, thereby providing a cooling effect to the heat producing electronic component. If the frequency of the pressure fluctuations is high enough, basically the same air volume is cyclically moved to transport the heat, and thus less dust and dirt can enter the chamber. Additionally, the porous element serves as a filter for larger dust or dirt particles.

Preferably, the first wall comprises a heat spreader, which is in thermal contact with the at least one electronic component.

The heat spreader serves to more efficiently transport the heat produced by the at least one electronic component towards the wall, which has the porous element, which again is cooled by the cyclically pushed out and sucked in air.

Preferably, the porous element is a sintered mass, preferably copper comprising particles or porous graphite, which is ideally suited to diffuse heat, which can be transported away by the cyclically air movement. The particles can for example be made of brass.

Preferably, at least a third wall of the first chamber is an air tight closure. Thus is guaranteed that air can only be moved through the at least one porous element.

Preferably, any of the walls of the first chamber comprises at least one hole (such as e.g. a nozzle, a slit, an elongated or a circular hole which produces air jets periodically due to the fluctuating of the first chamber air pressure.

Thus, the above described ventilation through the at least one porous element is advantageously combined with defined air jets produced by the holes, or nozzles. Advantageously, the holes are positioned not directly at the electronic component. The holes can, for example, be located in the wall, which comprises the porous element. They can be in the porous element or adjacent thereto. The air jets provide an additional cooling effect, due to further heat transport to the outside of the heat sink. The heat sink is thus laid out for a combined cooling effect, where one cooling component is the breathing through the porous element, and the other cooling component is the periodically produces air jets. Due to the restriction represented by the holes, the air jets can be turbulent. The higher the turbulence (Reynols number) the stronger the cooling effect can be.

Preferably, the opening diameter of the hole is in a range of 1 mm to 10 mm, in order to provide a sufficient, preferably turbulent, air flow between the inside and the outside of the heat sink.

Preferably, the at least one hole is arranged such that the cyclic air jets interact with the air volume outside of the first chamber surrounding the at least one porous element.

Thus, hot air, which is pushed out through the porous element in the second wall during the first movement cycle of the pressure producing means, in which the pressure inside the chamber is higher than outside the chamber, will be displaced by the air jet through the at least one hole in the same movement cycle. In the next movement cycle of the pressure producing means, in which the pressure inside the chamber is lower than outside the chamber and air is sucked in through the porous wall, not the previously expulsed hot air will be sucked in again, but rather fresh and cooler air, which has been transported to the air volume surrounding the porous element by secondary air flow, which was triggered by the air jet.

Preferably, the heat sink further comprises a second chamber wherein the first chamber and the second chamber share at least one wall, and pressure producing means connected to the second chamber, which are adapted to control a second chamber air pressure in the second chamber.

In this way a separate chamber for the formation of the air jets through the at least one hole and a separate chamber for the breathing through the porous element can be provided. Thus, a more efficient generation of the air jets can be obtained, since the pressure fluctuations in the second chamber directly produce the air jets. Since the second chamber is smaller than the first chamber, lower pressure fluctuations are now necessary to produce strong turbulent air jets.

Preferably, the pressure producing means is adapted to vary air pressure inside the second chamber to be alternately higher and lower than the air pressure outside the second chamber and the first chamber respectively, wherein the second chamber comprises at least one hole, which produces cyclic air jets due to the fluctuating second chamber air pressure.

Preferably, the at least one hole is arranged such that the cyclic air jets interact with the air volume outside the first chamber surrounding the at least one porous element. As explained above the interaction enhances the cooling effect.

Alternatively, the first wall comprises at least one porous element, and the first chamber and the second chamber are connected by pressure producing means adapted to set the second chamber air pressure higher than the outside air pressure, and to set the first chamber air pressure lower than the outside air pressure or adapted to set the second chamber air pressure lower than the outside air pressure, and to set the first chamber air pressure higher than the outside air pressure.

Thus, a unidirectional flow of air can be generated. Air will, for example, be sucked in through the porous wall. The air will then be transported to the second chamber and will be extracted through the at least one porous element of the second wall of the second chamber. A unidirectional fan effect is achieved. The fan effect flows through the heat sink connected with the electronic component, and thus achieves an efficient cooling effect of the electronic component.

Preferably, the second wall of the first chamber comprises at least one hole, which produces air jets, wherein the at least one hole is preferably arranged such that the air jets interact with the air volume outside the first chamber surrounding the at least one porous element.

Thus, the air jets expulsed through the at least one hole in the second wall of the first chamber can displace the hot air ejected through the porous wall, and can improve the cooling effect of the heat sink. The second chamber can naturally also only communicate with the outside of the chamber by means of the at least hole or nozzle, and in this case the porous element on the wall of the second chamber would be omitted.

The present invention is further directed to an LED lamp, especially to a retrofit LED lamp, operating with electronic components, wherein the LED lamp has a heat sink according to the above description for at least one of its electronic components.

In retrofit LED lamps very high intensity LEDs are typically used and the electronic components produce large heat. This heat can efficiently be countered by the heat sink according to the present invention.

The present invention is further directed to a cooling method for electronic components, comprising the steps of controlling a first chamber air pressure and a first chamber, wherein at least one electronic component is attached to a first wall of the first chamber, pushing out and sucking in air through a porous element of at least a second wall of the first chamber, respectively, by fluctuating the first chamber air pressure to be alternately higher and lower than the air pressure outside the first chamber.

In summary, the high surface of the porous element and possible turbulences, which are generated at the porous element (or in combination at holes or nozzles) give a tremendous increase in cooling efficiency of the heat sink. Especially, if secondary air flow on the outer surface of the porous element is created, for example by the pulsed air jets, the cooling efficiency can be optimized.

BRIEF DESCRIPTION OF THE DRAWINGS

The present invention will in the following be discussed in detail with respect to the attached drawings.

DETAILED DESCRIPTION OF THE INVENTION

Figure 1:
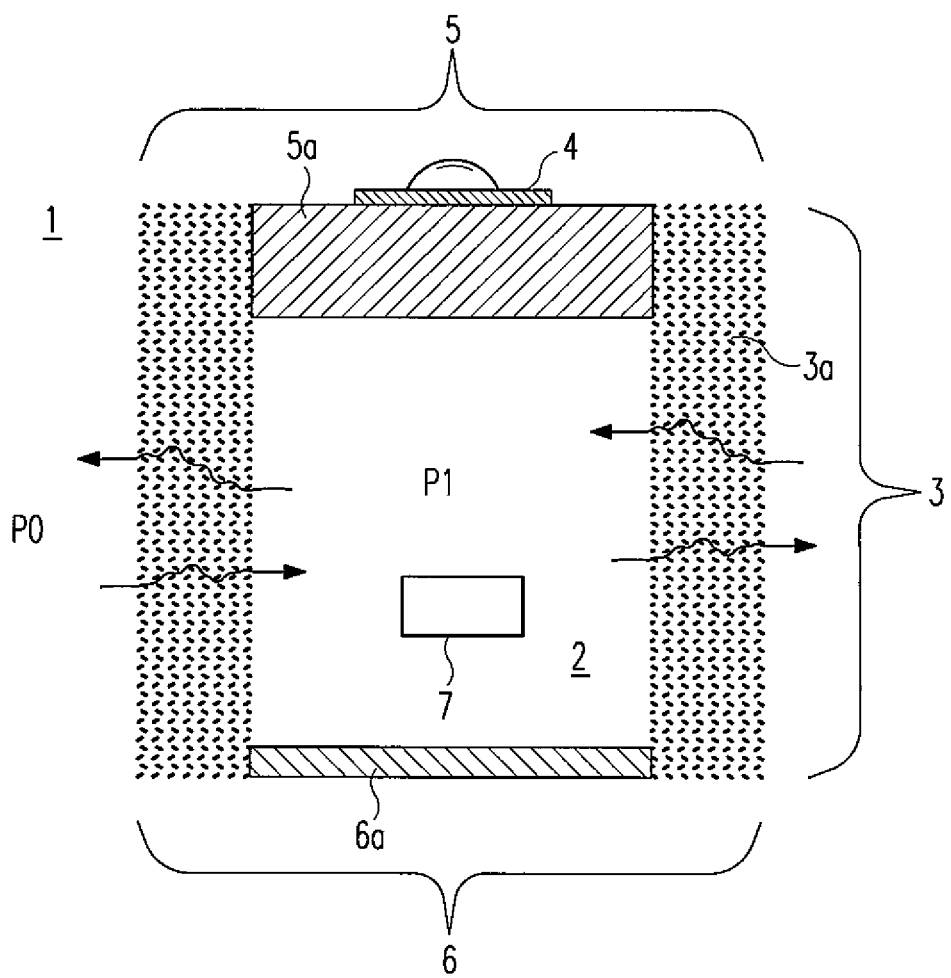
FIG. 1 shows a heat sink with a porous element according to the present invention for bidirectional air flow.

FIG. 1 shows a heat sink 1 according to the present invention, with which electronic components can be cooled. The heat sink 1 comprises a first chamber 2, which is constituted by a first wall 5, which is illustrated as being the upper horizontal wall of the chamber 2, onto which at least one electronic component 4 is mounted. The chamber 2 further comprises two second walls 3, shown as extending vertically, and the chamber 2 is finally closed off by a horizontal bottom wall 6. Of course the chamber 2 of the heat sink 1 can also have a shape other than a rectangular or a square shape, and could also have less or more than four walls. It can also be integrated with a LED lamp 100, which will be explained later in connection with FIGS. 6 and 7. However, the chamber 2 of the heat sink 1 comprises at least one wall, here the second wall 3, which has a porous element 3a.

The porous element 3a is preferably a sintered mass, preferably copper comprising particles of one or more other materials, e.g. brass particles, or porous graphite, which are well-suited materials to transport heat away from the electronic component 4. Further, the porous element 3a serves as a filter for avoiding that contamination, like dust or other particles enter the chamber 2. The inside of the chamber 2, which is defined by the walls 3, 5 and 6, is an enclosed air volume that is hermetically sealed to the outside, except for at least the porous openings of the porous element 3a.

The electronic component 4 can be attached to the outside or to the inside of a side wall of the chamber 2, here the first wall 5, wherein the side wall can also comprise a heat spreader 5a. In this case the electronic component 4 is in thermal contact with a preferably heat spreading carrier or substrate member 5a, which is thermally connected to the other walls of the chamber 2, in particular the second wall 3, which comprises the at least one porous element 3a. The member 5a can be made of the same material or can be made of a different material than the first wall 5. Preferably, the heat spreader has a high thermal conductivity, and is preferably made of a material like copper that conducts the heat fast and efficiently away from the electronic component 4. Also a less expensive material such as aluminum can be envisaged for the hat spreader 5a.

Besides, in FIG. 1 in the first chamber 2 is provided a first pressure producing means 7, which is adapted to vary a first chamber air pressure P1 in the first chamber 2. The first pressure producing means 7 can for example be a chamber with two membranes, which are sucking in and expulsing air in different phases of movement. Such membranes could be driven magnetically, comparably to loud speaker membranes. The membranes can also be driven by a pump containing a piezoelectric element, which is very easy to control with very low power consumption. Membranes also provide a way to implement pressure producing means 7 without frictional parts, guaranteeing a long lifetime. However, other suited devices, which are able to vary, and in particular to fluctuate, air pressure can also be used.

The first pressure producing 7 means does not necessarily have to be inside of the first chamber 2, but has to be connected to the first chamber 2, so that it can vary the pressure as explained above. The pressure producing means 7 could, for example, be connected from the outside to the outer wall of the first chamber 2.

In particular, the first pressure producing means 7 are designed to be able to fluctuate the first chamber air pressure P1 in the first chamber 2, so that it is fluctuating between a state where it is higher and a state where it is lower than the air pressure P0 outside of the first chamber 2. The fluctuation is performed preferably 20 to 100 times per second, more preferably 40 to 60 times per second.

If the air pressure P1 inside the first chamber 2 is alternately higher or lower than the outside air pressure P0, air is caused to be cyclically pushed out and sucked in to the first chamber 2 through the at least one porous element 3a. The cyclically moving air interacts with the large surface of the pores of the porous element 3a, which provide a good interface between the second wall 3 and the air. The porous element 3a is preferably designed in a way that turbulences are created in the pores of the porous element 3a, when the air is cyclically pushed out and sucked in. The turbulences increase the cooling effect of the porous element 3a and consequently the heat sink 1. For best results, the pores of the porous element 3a are chosen to have a diameter in a range of 50 to 500 μm. The porosity of the porous element 3a, that means the ratio the pores take of the total surface of the porous element 3a should be in a range of 10 to 50%.

The above described breathing effect through the porous element 3a, which is triggered by the pressure fluctuations generated by the pressure producing means 7, can be combined with a second cooling effect explained in the following. Note, however, that each cooling effect can also be used individually. The second cooling effect makes use of defined air jets 9, which are produced by holes 8, slits or nozzles, which are for example provided in the wall (can be a substrate or printed circuit board), on which the at least one electronic component 4 is mounted, or are provided in the member 5a.

The hole(s) 8 maybe be positioned in/on the member 5a of the LED 4, but distanced from the LED 4.

Figure 2:
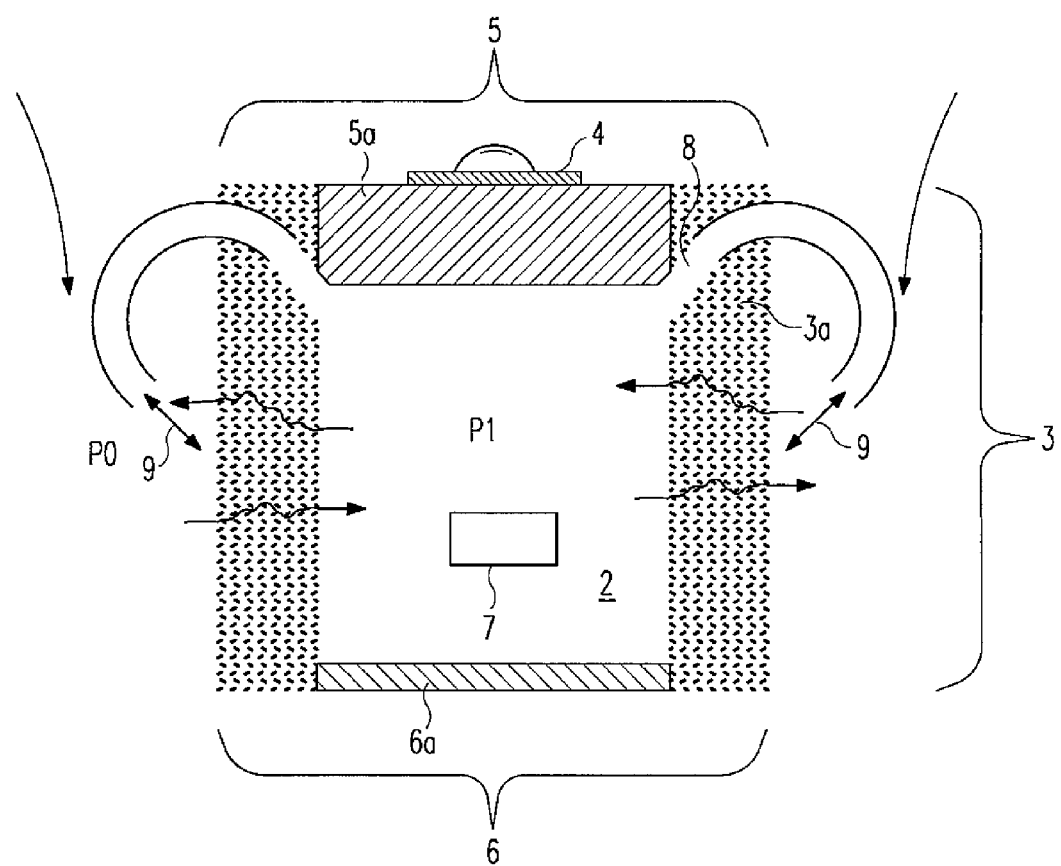
FIG. 2 shows a heat sink with a porous element and a nozzle according to the present invention for bidirectional air flow.

Alternatively the holes are incorporated into the second wall 3 with the porous element 3a, or into the porous element 3a itself. FIG. 2 shows two such holes 8, which are provided in the second wall 3 in the porous element 3a. The holes 8 can be nozzles or other kind of restrictions for air flow, which are preferably narrow enough that by the fluctuating air pressure generated by the pressure producing means 7, turbulent air jets 9 are formed through the holes 8. The turbulent air jets 9 then affect the surface of the second wall 3 and transport hot air to the outside. The air jets 9 thus cool the second wall 3 and the heat sink 1. Consequently also the at least one electronic component 4 exhibits a cooling effect. The cooling effect caused by the air jets 9 can combine advantageously with the cooling effect caused by the breathing through the at least one porous element 3a. The air jets 9 are produced directly at the holes 8, simply due to the fluctuating pressure P1 inside the chamber, whereas the pressure producing means 7 can be distanced from the holes 8. The holes 8 have an opening diameter in a range of 1 mm to 10 mm, so that sufficiently strong air jets 9 are produced, which allow sufficient air flow through the holes 8 and are preferably turbulent.

The holes 8 can be further provided with additional restrictions 8a, like a grid or a net, which can on the one hand side enhance the degree of turbulence of the cyclic air jets 9, and can on the other hand side prevent dust, dirt or other particles from entering into the first chamber 2. The holes 8 or nozzles are preferably arranged such that they interact with the air volume surrounding the at least one porous material 3a. As indicated in FIG. 2, the air jets 9 flow out of the first chamber 2 and preferaably circulate to the porous elements 3a. Depending on where the holes 8 are located, additional air reflectors for the air flow could be mounted to the first chamber 2, in order to guide the air jets 9 to the correct location, so that the air jets 9 interact with the air volume surrounding the porous elements 3a. The combined cooling effect of the breathing through the at least one porous element 3a and the air jets 9 can thus be even further strengthened, if the above-mentioned interaction takes place.

In particular, in a cycle, when the pressure P1 is higher inside of the first chamber 2 than outside of the first chamber 2, air is on the one hand side pushed out through the at least one porous element 3a, and is on the other side pushed out as a turbulent air jet 9 through the at least one hole 8. The air pushed out from the porous element 3a is air, which transports heat from the at least one electronic component 4. If in the next cycle of the pressure producing means 7 the pressure P1 inside the first chamber 2 becomes lower than the pressure P0 outside, air is sucked in through the at least one porous element 3a, and also a turbulent air jet 9 flows inwards through the hole 8. If the two cycles follow very shortly after each other, the danger is that the hot air expulsed in the first cycle through the at least one porous element 3a is again sucked in the next cycle through the at least one porous element 3a, and the cooling effect is not optimized. However, when in the first cycle the air jets 9 interact with the air volume outside of the surface of the at least one porous element 3a, and preferably displace, i.e. push away the hot air, which is expulsed through the at least one porous element 3a, the cooling effect in the next cycle can be increased. The air jet 9 displaces the hot air outside the at least one porous element 3a, and draws in secondary fresh, in particular cooler, air from the surrounding environment of the first chamber 2. Thus, in the second cycle, when air is sucked in through the at least one porous element 3a the sucked in air is cooler, and the cooling effect of the heat sink is enhanced significantly.

Figure 3:
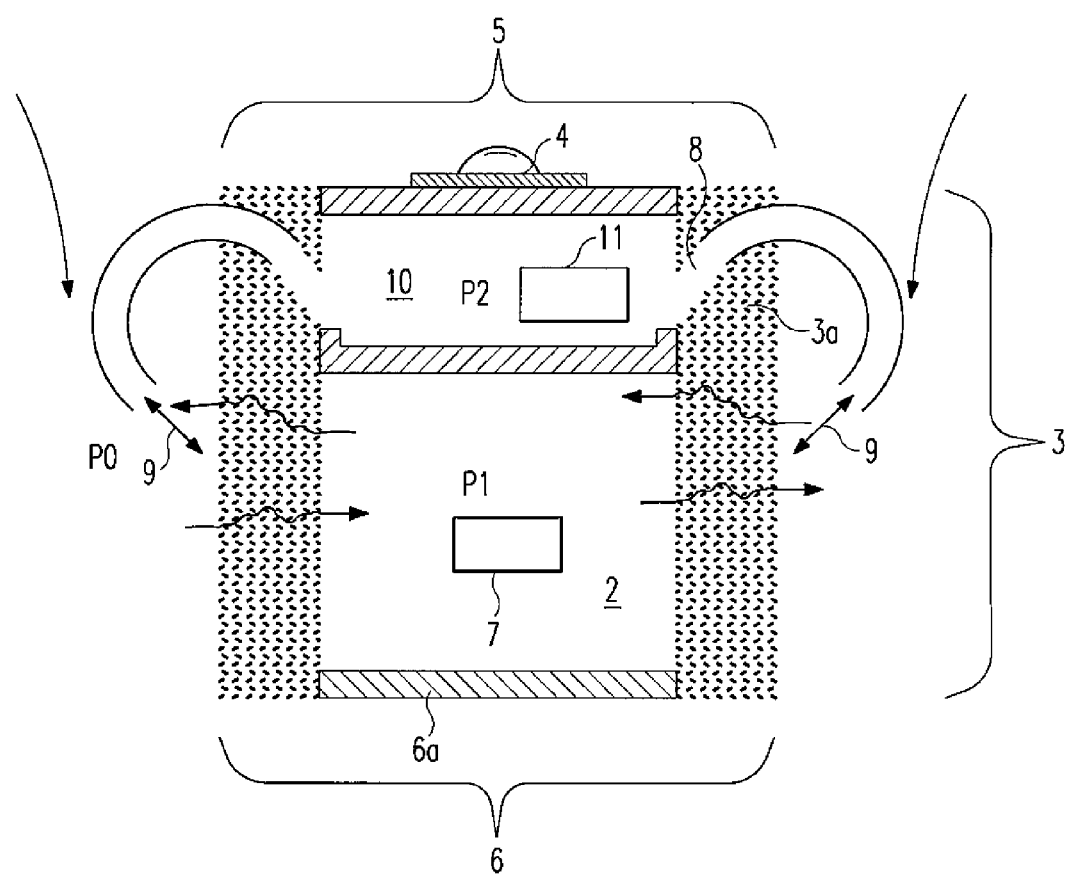
FIG. 3 shows a heat sink with two chambers according to the present invention for bidirectional air flow.

FIG. 3 shows another embodiment of the heat sink 1 according to the present invention. In FIG. 3 a first chamber 2 and a second chamber 10 are illustrated. The second chamber 10 is preferably provided in a way that the first chamber 2 and the second chamber 10 share at least one wall, for example as in FIG. 3 the first wall 5, to which the at least one electronic component 4 is attached. Each chamber 2, 10 can be equipped with individual pressure producing means 7, 11. Here the first chamber 2 is equipped with first pressure producing means 7, and the second chamber 10 is equipped with second pressure producing means 11. However, also single pressure producing means can be designed, in order to vary or fluctuate the air pressure in both of the chambers 2, 10, respectively. Again the pressure producing means 7, 11 do not necessarily have to be provided inside of the first chamber 2 and second chamber 10, respectively. However, a pressure producing means 7, 11 has to be connected to each of the chambers 2, 10, in order to vary the pressure. A single pressure producing means can also connect the two chambers, and fluctuate both pressures. In the case of two pressure producing means 7, 11, the first pressure producing means 7 is particularly adapted as described above, to vary and fluctuate the air pressure P1 in the first chamber 2 to cause the breathing effect through the at least one porous element 3a. The second pressure producing means 11 is functioning the same way, and can be constructed equivalent to the first pressure producing means 7. The second pressure producing means 11 for example causes the air pressure P2 in the second chamber 10 to fluctuate, whereby the cyclic air jets 9 through the at least one hole 8, as described for the first embodiment, are produced. Since the air volume of the second chamber 10 is smaller than the air volume of the first chamber 2, only small pressure fluctuations are necessary to produce efficient equivalent air jets 9, which interact with the air volume surrounding the porous element 3a outside of the heat sink 1. The two pressure producing means 7, 11 can be operated simultaneously, or can exhibit slightly different cycle times, i.e. slightly different frequencies. Different cycle times can compensate for chamber geometry. For example, say that pushing out the air through the at least one porous element 3a takes slightly longer or shorter than pushing out the air jets 9 to the volume surrounding the porous element 3a. Then it could be beneficial to set the two cycle times different from each other, so that the air jets 9 will nevertheless interact with the air volume surrounding the at least one porous element 3a, and will interact exactly at the moment, when hot air is expulsed from the first chamber 10 through the at least one porous element 3a. This way, the best possible cooling effect can be achieved.

The one or two separate pressure producing 7, 11 means can be controlled by a control unit. The control unit could for example set the amount of the pressure variations, or the cycle times. The control unit could also receive feedback from a temperature sensor, and could automatically vary the parameters, which influence the cooling efficiency of the heat sink 1, until the lowest temperature is fed back from the temperature sensor. Thus, the invention could also cope with changes in the cooling efficiency with time, which could for example arise, if dust or dirt particles block pores of the porous element 3a, or block the at least one hole 8. If an increasing temperature is sensed, also a warning signal could be issued.

Until now the above described embodiments were directed to bidirectional air flow caused by the fluctuating air pressure, preferably an alternately higher or lower air pressure inside the first or the second chamber, respectively, compared to the outside air pressure. As a result, the cyclic breathing through the at least one porous element 3a and the cyclic air jets 9 produced by the at least one hole 8 contribute to the cooling effect of the heat sink 1.

Figure 4:
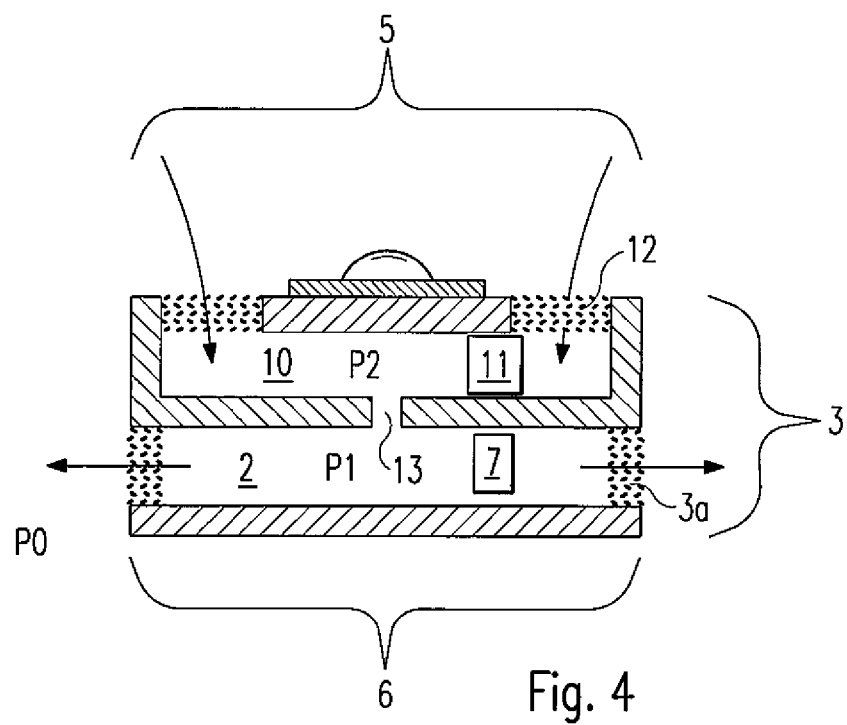
FIG. 4 shows a heat sink according to the present invention for unidirectional air flow.

Alternatively, a heat sink 1 with unidirectional flow, as presented in the following as third embodiment, can be realized. For example, FIG. 4 again shows a heat sink 1, with two separate chambers 2, 10. Again, the chambers 2, 10 share at least one wall, in FIG. 4 the first wall 5, onto which the at least one electronic component 4 is mounted. In FIG. 4 the first wall 5 comprises at least one porous element 12, and the second wall 3 in the area of the first chamber 2 comprises at least one porous element 3a. The pressure producing elements 7, 11 are provided in each of the chambers 2, 10. The chambers 2, 10 are connected by an opening 13. The second chamber 10 and the first chamber 2 can also be connected by a single pressure producing means 7, 11 of the heat sink 1. The pressure producing means 7, 11 either operate in a way, that the second chamber air pressure P2 is always set higher than the outside air pressure P0, and the first chamber air pressure P1 is always set lower than the outside air pressure P0. This means of course that the first chamber air pressure P1 is always lower than the second chamber air pressure P2. In this configuration a unidirectional flow of air through the porous elements 12 and 3a, respectively, is created, wherein air flows in from the outside into the second chamber 10, from which the air flows further through the opening 13 to the first chamber 2, from which the air flows further through the at least one porous element 3a to the outside. Alternatively, the pressure producing means operate in a way, that the second chamber air pressure P2 is always set lower than the outside air pressure P0, and the first chamber air pressure P1 is always set higher than the outside air pressure P0. This means of course that the first chamber air pressure P1 is always higher than the second chamber air pressure P2. In this configuration a unidirectional flow of air through the porous elements 3a and 12, respectively, is created, wherein air flows in from the outside into the first chamber 10, from which the air flows further through the opening 13 to the first chamber 2, from which the air flows further through the at least one porous element 12 to the outside. Since the at least one porous element 12 is located close to the at least one electronic component 4, the fan-like air flow passes close by the heat source, whereby a good cooling effect is achieved. Since further turbulences can be created in the at least one porous elements 3a and 12, respectively the cooling of the electronic component 4 can be enhanced. Both the porous elements 12 and 3a serve also as a protection from dust and other dirt particles, which might otherwise enter the first or the second chamber 10, respectively.

Figure 5:
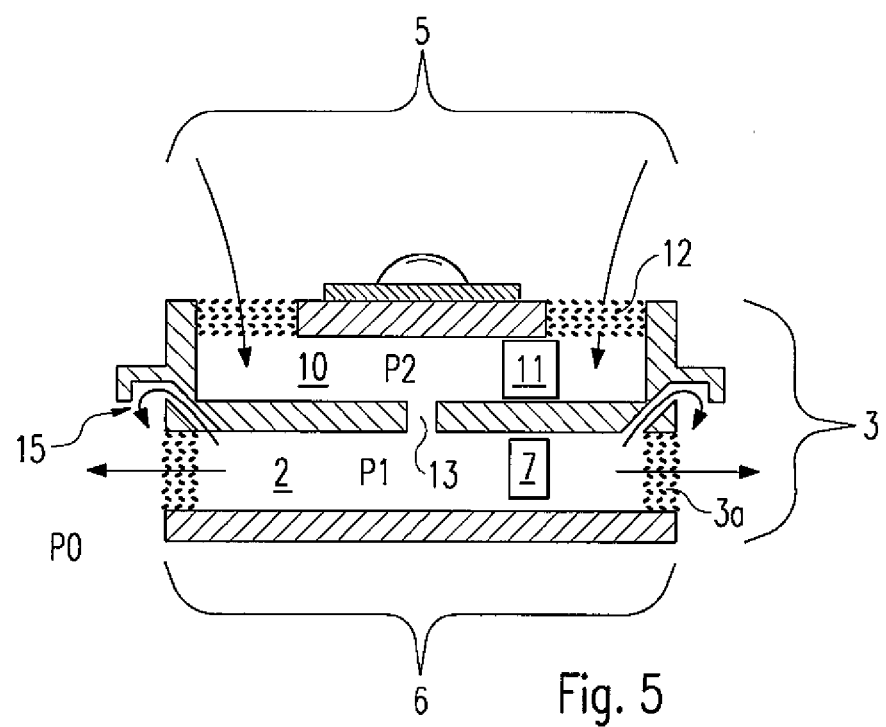
FIG. 5 shows a heat sink with nozzles according to the present invention for unidirectional air flow.

FIG. 5 shows how the above-described embodiment is combined additionally with the concept of the holes or nozzles, here provided in the first chamber 2, which produce air jets 15. In contrast to the above embodiments, the air jets 15 are now also unidirectional and flow for example out of the first chamber 2. Of course unidirectional air jets 15 can be generated to flow in either direction, depending on how the pressures inside the chambers are set. The air jets 15 are divided in such a way that they interact with the air volume outside of the at least one porous element 3a, and thus produce the same additional cooling effect as described above. The cooling is made more efficiently, since the hot expulsed air outside of the at least one porous element 3a is displaced and replaced by fresh and cooler air.

Additionally, at least one nozzle or hole in the second chamber 10 could be provided to produce further air jets flowing into the second chamber 10. These air jets could directly affect the surface of the at least one electronic component 4, and could improve the cooling of the hot surfaces. Also a combination of at least one porous element and at least one hole, provided for each of the two chambers, can be realized. The heat sink 1 can comprise also more than two chambers, which are either connected to each other by openings, or hermetically sealed to each other.

The present invention also discloses a LED lamp 100, especially a retrofit LED lamp, which typically operates with electronic components 4 to operate at least one LED inside of the bulb 10 of such a lamp 100. Since for retrofit LED lamps 100 particularly high efficient LEDs are used, it is beneficial to have a good heat sink for the cooling of the electronic components. Thus, a heat sink 1 as described in any of the embodiments above can be implemented in such a LED lamp 100.

Figure 6:
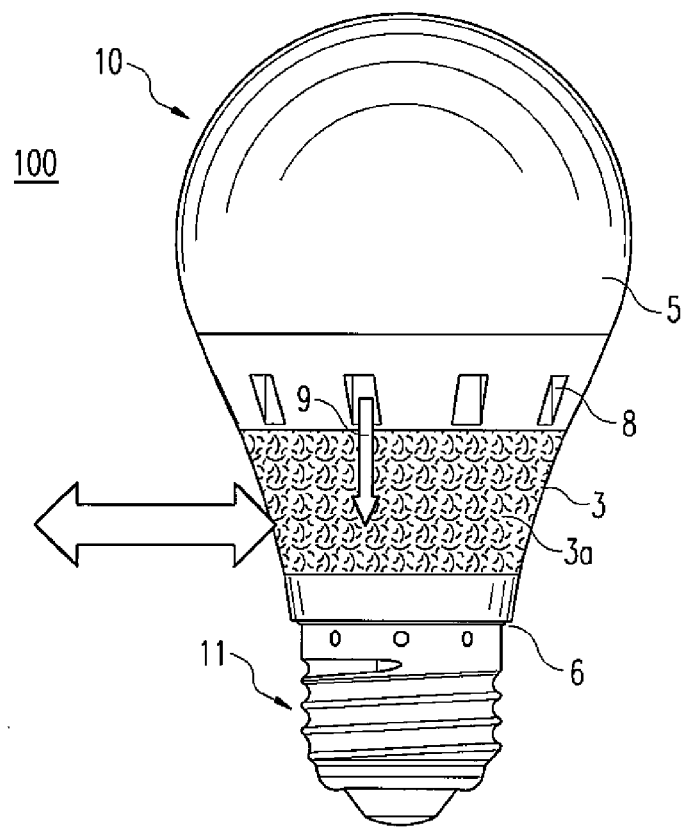
FIG. 6 shows a LED lamp, in particular a retrofit LED lamp, according to the present invention for bidirectional air flow.

FIG. 6 shows an LED lamp 100, preferably a retrofit LED lamp, according to the present invention laid out for a bidirectional air flow. The LED lamp 100 has a bulb 10, which is preferably made of glass or plastic, and is transparent to visible light. The bulb 10 preferably has the typical mostly spherical shape known from common electric bulbs. The bulb 10 has a socket 11 on one of its ends, which is preferably made to fit standard connectors for electric power supply of the lamp 100. Inside of the lamp 100 at least one or more LEDs produce visible light. The bulb 10 can be provided with a phosphorous material, which converts the light emitted from the one or more LEDs, or adds one or more further spectral lines to the emitted light, by stimulated emission. For example, the LEDs inside the bulb 10 can be designed to emit blue light, and a phosphorous material inside the bulb 10 or provided as a sheet on the outside or inside surface of the bulb 10, emits another wavelength when hit with the blue light. In total the light emitted from the LED lamp 100 will appear white. Another way to produce white light inside the LED lamp 100 is to provide multiple, differently colored LEDs can be arranged, which in combination appear white to an outside viewer.

Inside the bulb 10, or integrated as a part of the bulb 10, the heat sink 1 as described above is implemented and arranged. At least the electronic components 4 operating the at least one LED, and preferably also the LED itself, are mounted to the heat sink 1 inside the bulb 10. FIG. 6 shows in particular a retrofit LED lamp 100, where the heat sink 1 is integrated with the bulb 10. The inside of the bulb 10 here represents the first chamber 2, and the upper, nearly hemispherical part of the bulb 10 represents the first wall 5. The lower part of the bulb 10, between the upper part and the socket 11, represents the second wall 3, and can either partly or fully be made of a porous element 3a. In FIG. 6 it is partly made of a porous element 3a, and the other part of the second wall 3 is an airtight part, which comprises holes 8 or nozzles. Through the porous element 3a air is expulsed and sucked in with the operation of pressure producing means 7 provided inside the lamp 100. The bidirectional air flow is indicated by the horizontal arrows. Additionally, air jets 9 indicated by the vertical arrow, are expulsed through the holes 8. The holes 8 are arranged such that the air jets 9 interact with the air volume surrounding the LED lamp 100 outside of the porous element 3a. In FIG. 6 this can be achieved with help of the shape of the bulb 10 of the retrofit LED lamp 10. The mostly spherical shape, i.e. the broadening of the bulb 10 in the upper part, arranges the holes 8 above the porous element 3a slightly tilted, so that expulsed air jets are directed to floe downwards—in direction of the socket 11—along the outside of the lamp 100. Thus, an interaction with the air outside the porous element 3a occurs and enhances the cooling effect, as explained above.

The casing of the bulb 10 might have further openings, like slots, holes or the like at the socket 11, so that also there air is periodically pushed out from the inner volume of the bulb 10, and then is sucked in again, when the second phase of a heat sink 1 according to the present invention with bidirectional air flow is in effect.

Figure 7:
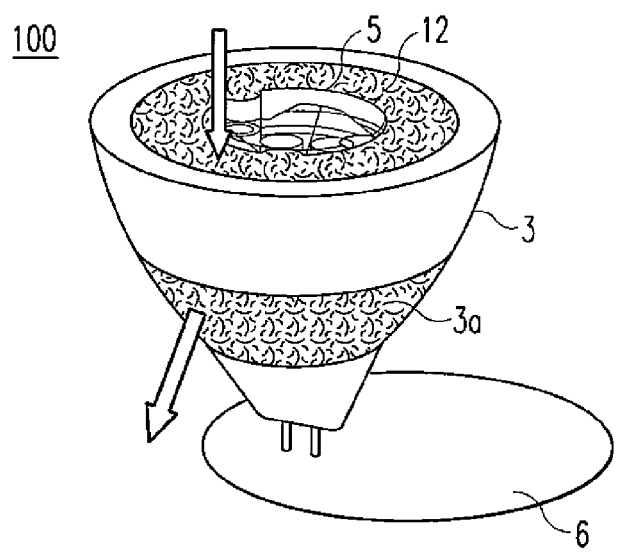
FIG. 7 shows a LED lamp according to the present invention for unidirectional air flow.

FIG. 7 shows another LED lamp 100, which has an integrated heat sink 1 designedt for unidirectional air flow. The first wall 5 at the top of the lamp 100 comprises a porous element 12 and is further provided with the at least one LED. A transparent window is for example visible in the first wall 5, through which the LED can emit light from the inside. The second wall 3 represented by the side walls of the LED lamp 100 comprises another porous element 3a. The bottom of the lamp 100 represents the third wall 6, which is airtight and ends in a socket or connector. Inside of the first, second and third wall, 5, 3, 6, at least two chambers are defined, and at least one pressure producing means is provided, which for example connects the two chambers. By applying the above mentioned relations between the first chamber pressure, the second chamber pressure and the outside pressures, a unidirectional air flow can be generated. In FIG. 7 the unidirectional air flow is indicated by arrows, and air is sucked into the heat sink 1 of the lamp 100 through the porous element 12 and is expulsed through the porous element 3a. Naturally one of the walls of the LED lamp 100 could also comprise holes 8, slits or nozzles, in order to produce air jets if needed.

The present invention also encompasses the use of a cooling method in any kind of LED lamp 100, especially a retrofit LED lamp. Such a method would include the steps of controlling a first chamber air pressure in a first chamber 2, wherein at least one electronic component 4 is attached to a first wall 5 of said first chamber 2. Further, the method would comprise pushing out and sucking in air through porous elements 3a of at least a second wall 3 of the first chamber 2, respectively, by fluctuating the first chamber air pressure P1 to be alternately higher and lower in the air pressure P0 outside of the first chamber 2.

All the above-mentioned embodiments serve to provide an efficient cooling for electronic components 4, which preferably operate LEDs. All features described in the original embodiments above can be combined as desired, and depending on the circumstances, which provide the best effects. In particular, the combined cooling effect by breathing through porous elements interacting with directed air jets provides a high cooling efficiency.

The invention claimed is:

1. Heat sink (1) for electronic components (4), comprising a chamber (2), wherein at least one electronic component (4) is attached to a first wall (5) of the chamber (2), and wherein at least a second wall (3) of the chamber (2) comprises at least one porous element (3a); and pressure producing means (7) provided connected to the first chamber (2), which are adapted to vary a first chamber air pressure (P1) in the first chamber (2).

2. Heat sink (1) according to claim 1, wherein the pressure producing means (7) are adapted to actively vary the air pressure (P1) in the chamber (2) to be alternately higher or lower than the ambient air pressure (P0) outside of the first chamber (2), causing air to be pushed out and sucked in of the first chamber (2) through the at least one porous element (3a), respectively.

3. Heat sink (1) according to claim 1, wherein the first wall (5) comprises a heat spreader (5a), which is in thermal contact with the at least one electronic component (4).

4. Heat sink (1) according to claim 1, wherein the porous element (3a) is a sintered mass, preferably copper comprising particles, or porous graphite.

5. Heat sink (1) according to claim 1, wherein at least a third wall (6) of the chamber (2) is an airtight closure (6a).

6. Heat sink (1) according to any of claim 2, wherein any of the walls of the chamber (2) comprises at least one hole (8), which produces air jets periodically (9) due to the fluctuating first chamber air pressure (P1).

7. Heat sink (1) according to claim 6, wherein the opening diameter of the hole is in a range of 1 mm to 10 mm.

8. Heat sink (1) according to any of claim 6, wherein the at least one hole (8) is arranged such that the cyclic air jets (9) interact with the air volume outside the chamber (2) surrounding the at least one porous element (3a).

9. Heat sink (1) according to claim 1, further comprising
a second chamber (10) wherein the (first) chamber (2) and the second chamber (10) at least share one first common wall; and
pressure producing means (7, 11) connected to the second chamber (10), which are adapted to vary a second chamber air pressure (P2) inside the second chamber (10).

10. Heat sink (1) according to claim 9,
wherein the pressure producing means (7, 11) is adapted to actively vary or modulate the air pressure (P2) of the second chamber (10) to be alternately higher and lower than the ambient air pressure (P0),
wherein at least one of the chambers (2, 10) comprises at least one hole (8), such as e.g. a slit or a nozzle, which produces cyclic air jets (9) due to the fluctuating second chamber air pressure (P2).

11. Heat sink (1) according to claim 10, wherein the at least one hole (8) is arranged such that the cyclic air jets interact with the air volume outside the first chamber (2) surrounding the at least one porous element (3*a*).

12. Heat sink (1),
having a first wall (5) which comprises at least one porous element (12),
wherein a first chamber (2) and a second chamber (10) are connected by pressure producing means (7, 11) adapted to set the second chamber air pressure (P2) higher than the outside air pressure (P0), and to set the first chamber air pressure (P1) lower than the outside air pressure (P0), or adapted to set the second chamber air pressure (P2) lower than the outside air pressure (P0), and to set the first chamber air pressure higher than the outside air pressure (P0).

13. Heat sink (1) according to claim 12, wherein a second wall (3) of the first chamber (2) comprises at least one hole (14), which produces air jets (9, 15), wherein the at least one hole (14) is preferably arranged such that the air jets (9, 15) interact with the air volume outside the first chamber (2) surrounding the at least one porous element (3*a*).

14. LED lamp (100), especially retrofit LED lamp, operating with electronic components (4), wherein the LED lamp (100) has a heat sink (1) according to claim 1 for at least one of its electronic components (4).

15. Heat sink (1) for electronic components (4), comprising
a chamber (2), wherein at least one electronic component (4) is attached to a first wall (5) of the chamber (2); and
pressure producing means (7) provided connected to the first chamber (2), which are adapted to vary a first chamber air pressure (P1) in the first chamber (2) to be alternately higher or lower than the ambient air pressure (P0) outside of the first chamber (2);
wherein any of the walls of the chamber (2) comprises at least one hole (8), which produces air jets periodically (9) due to the fluctuating first chamber air pressure (P1).

16. Heat sink (1) for electronic components (4), comprising
a first chamber (2), wherein at least one electronic component (4) is attached to a first wall (5) of the chamber (2), and wherein at least a second wall (3) of the chamber (2) comprises at least one porous element (3*a*); and
a second chamber (10) wherein the first chamber (2) and the second chamber (10) at least share one first common wall;
pressure producing means (7) connected to the first chamber (2), which are adapted to vary a first chamber air pressure (P1) inside the first chamber (2), and
pressure producing means (7, 11) connected to the second chamber (10), which are adapted to vary a second chamber air pressure (P2) inside the second chamber (10).

17. Cooling method for electronic components (4), comprising the steps of
controlling a first chamber air pressure (P1) in a first chamber (2), wherein at least one electronic component (4) is attached to a first wall (5) of the first chamber (2);
pushing out and sucking in air through a porous element (3*a*) of at least a second wall (3) of the first chamber (2), respectively, by fluctuating the first chamber air pressure (P1) to be alternately higher and lower than the air pressure (P0) outside of the first chamber (2).

* * * * *